US 6,709,267 B1

(12) United States Patent
Hawkins et al.

(10) Patent No.: US 6,709,267 B1
(45) Date of Patent: Mar. 23, 2004

(54) SUBSTRATE HOLDER WITH DEEP ANNULAR GROOVE TO PREVENT EDGE HEAT LOSS

(75) Inventors: Mark Hawkins, Gilbert, AZ (US); Matthew G. Goodman, Chandler, AZ (US); Loren Jacobs, Chandler, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/331,444

(22) Filed: Dec. 27, 2002

(51) Int. Cl.$^7$ ................................. F27D 5/00
(52) U.S. Cl. ................. 432/258; 432/253; 118/728; 118/500; 392/418; 414/935
(58) Field of Search ............... 432/253, 258, 432/260, 259; 118/728, 500; 392/418; 414/935

(56) References Cited

U.S. PATENT DOCUMENTS

| | | |
|---|---|---|
| 4,560,420 A | 12/1985 | Lord |
| 4,931,313 A * | 6/1990 | Arakawa et al. ............ 427/164 |
| 4,978,567 A | 12/1990 | Miller |
| 4,986,215 A | 1/1991 | Yamada et al. |
| 5,188,501 A | 2/1993 | Tomita et al. |
| 5,198,034 A | 3/1993 | de Boer et al. |
| 5,242,501 A | 9/1993 | McDiarmid |
| 5,403,401 A | 4/1995 | Haafkens et al. |
| 5,427,620 A | 6/1995 | de Boer et al. |
| 5,514,439 A | 5/1996 | Sibley |
| 5,551,985 A | 9/1996 | Brors et al. |
| 5,561,612 A | 10/1996 | Thakur |
| 5,588,827 A | 12/1996 | Muka |
| 5,591,269 A | 1/1997 | Arami et al. |
| 5,690,742 A | 11/1997 | Ogata et al. |
| 5,761,023 A | 6/1998 | Lue et al. |
| 5,762,713 A | 6/1998 | Paranjpe |
| 5,792,273 A | 8/1998 | Ries et al. |
| 5,800,622 A | 9/1998 | Takemi et al. |
| 5,803,977 A | 9/1998 | Tepman et al. |
| 5,851,929 A | 12/1998 | Thakur et al. |
| 5,856,652 A | 1/1999 | Mayuzumi |
| 5,881,208 A | 3/1999 | Geyling et al. |
| 5,926,742 A | 7/1999 | Thakur et al. |
| 6,001,183 A | 12/1999 | Gurary et al. |
| 6,002,663 A * | 12/1999 | Sandstrom .................. 369/282 |
| 6,034,356 A | 3/2000 | Paranjpe |
| 6,113,702 A | 9/2000 | Halpin et al. |
| RE36,957 E | 11/2000 | Brors et al. |
| 6,203,622 B1 | 3/2001 | Halpin et al. |
| 6,245,152 B1 | 6/2001 | Imai et al. |
| 6,301,434 B1 | 10/2001 | McDiarmid et al. |
| 6,310,327 B1 | 10/2001 | Moore et al. |
| 6,331,212 B1 | 12/2001 | Mezey, Sr. |
| 6,342,691 B1 | 1/2002 | Johnsgard et al. |
| 6,394,797 B1 | 5/2002 | Sugaya et al. |
| 2001/0046768 A1 | 11/2001 | Mezey, Sr. |
| 2002/0011211 A1 | 1/2002 | Halpin |
| 2002/0011478 A1 | 1/2002 | Ratliff et al. |

FOREIGN PATENT DOCUMENTS

| | | |
|---|---|---|
| JP | 07018438 | 1/1995 |
| JP | 08148541 | 6/1996 |
| JP | 2000315720 | 11/2000 |

OTHER PUBLICATIONS

Newman et al., "Rapid Thermal Processing," *RTP*, http://www.isr.umd.edu, Jun. 24, 2002, pp. 1–4.

* cited by examiner

*Primary Examiner*—Jiping Lu
(74) *Attorney, Agent, or Firm*—Knobbe, Martens, Olson & Bear LLP

(57) ABSTRACT

A substrate holder for processing a semiconductor substrate includes a deep, generally vertical annular groove configured to impede the radial flow of heat within the holder and reduce heat loss from the annular side edge of the holder. The holder includes one or more support elements, such as a flat contiguous surface or a plurality of protrusions defined by intersecting grooves. The one or more support elements are configured to support a substrate a particular size in a support plane defined by the one or more support elements. The groove is configured to surround an outer edge of the substrate when the substrate is supported on the one or more support elements. In a preferred embodiment, the groove has a depth of at least 25% of the thickness of the substrate holder.

52 Claims, 7 Drawing Sheets

SUBSTRATE HOLDER WITH DEEP ANNULAR GROOVE TO PREVENT EDGE HEAT LOSS

RELATED APPLICATION

This application incorporates by reference the entire disclosure of U.S. patent application Ser. No. 09/747,173, entitled "SUSCEPTOR POCKET PROFILE TO IMPROVE PROCESS PERFORMANCE," filed Dec. 22, 2000.

FIELD OF THE INVENTION

The present invention relates generally to substrate holders and, in particular, to substrate holders configured to prevent heat loss at the outer peripheral edge of the holder.

BACKGROUND OF THE INVENTION

High-temperature ovens, or reactors, are used to process substrates for a variety of reasons. In the electronics industry, substrates such as semiconductor wafers are processed to form integrated circuits. A substrate, typically a circular silicon wafer, is placed on a substrate holder. If the substrate holder helps to attract radiant heat, it is called a susceptor. The substrate and substrate holder are enclosed in a reaction chamber, typically made of quartz, and heated to high temperatures by a plurality of radiant heat lamps placed around the quartz chamber. In an exemplary high temperature process, a reactant gas is passed over the heated substrate, causing the chemical vapor deposition (CVD) of a thin layer of the reactant material onto a surface of the substrate. Through subsequent processes, these layers are made into integrated circuits.

It is generally desirable to maintain a uniform temperature throughout the substrate holder during substrate processing. Typically, the substrate temperature closely tracks that of the substrate holder. Non-uniformities in the temperature of the substrate holder result in non-uniformities in the substrate temperature. These temperature gradients can leave the substrate susceptible to crystallographic slip in the single-crystal substrate and epitaxial layers, and possible device failure. Thus, temperature uniformity is desirable to minimize these problems. Another reason why it is desirable to maintain a uniform temperature throughout the substrate holder is to prevent differences in the quality of the film deposited on the substrate. Generally, temperature gradients in the substrate result in different rates of deposition, and thus non-uniformities, throughout the substrate.

Using state of the art apparatuses and methods, temperature uniformity has been achieved throughout most of the combination of the substrate and the substrate holder. However, it is difficult to keep the radially outer region of the substrate/holder combination (the "combination") as hot as the inner region. This is because the radially outer region experiences greater convective and conductive heat loss and, in many existing apparatuses, receives less direct radiation.

The radially outer region of the substrate/holder combination experiences greater convective heat loss than the remainder of the combination because the outer region has a generally vertical side edge and, hence, a larger surface area at which heat loss occurs. The outer region of the combination can also lose conductive heat due to contact with other equipment. These disparities in heat loss between the radially outer region and the remainder of the combination result in a lower temperature in the outer region. In some reactors, this temperature disparity is heightened because the vertical side edge of the combination receives less direct radiation from the heat sources. This temperature disparity produces a different deposition rate and deposited film thickness near the outer edge of the substrate. Accordingly, a processed substrate is typically characterized by an "exclusion zone" near the substrate edge, within which the deposited film has non-uniform qualities.

Some prior art attempts to minimize or remove the exclusion zone have focused upon directing a greater amount of radiant energy to the radially outer, as opposed to inner, region of the substrate holder during processing, in order to lessen the disparity in heat loss between such regions. Other attempts have focused upon providing a hot annular structure (e.g., a temperature compensation ring) near the periphery of the substrate holder, to reduce the heat loss from the outer region. While these efforts have been helpful, some disparity in heat loss between the inner and outer regions remains. Using state of the art processing methods and apparatuses, the annular thickness of exclusion zones is generally about 10–20 mm, while chip manufacturers strive to enforce exclusion zones as small as 3 mm to maximize yield. A need exists to further shrink the exclusion zone.

SUMMARY OF THE INVENTION

Accordingly, it is a principle object and advantage of the present invention to overcome these limitations and to provide an improved substrate holder.

In one aspect, an apparatus for processing a substrate is provided. The apparatus comprises a substrate holder having a thickness defined as a distance between generally parallel top and bottom surfaces of the substrate holder. The substrate holder has one or more support elements configured to support a substrate of a particular size in a support plane defined by the one or more support elements. The substrate holder has an annular groove configured to surround an outer edge of the substrate when the substrate is supported on the one or more support elements. The groove has a depth of at least 25% of the thickness of the substrate holder.

In another aspect, an apparatus for processing a substrate is provided, comprising a reaction chamber, a plurality of heating elements configured to heat the reaction chamber, and a substrate holder in the reaction chamber. The substrate holder has a thickness defined as a distance between generally parallel top and bottom surfaces of the substrate holder. The substrate holder has one or more support elements configured to support a substrate of a particular size within a support plane defined by the one or more support elements. The substrate holder has an annular groove configured to surround an outer edge of the substrate when the substrate is supported on the one or more support elements. The groove has a depth of at least 25% of the thickness of the substrate holder.

In another aspect, an apparatus for processing a substrate is provided. The apparatus comprises a substrate holder having a thickness defined as a distance between generally parallel top and bottom surfaces of the substrate holder. The substrate holder has a support surface sized to support a substrate of a particular size in a support plane. The substrate holder has an annular groove sized to surround an outer edge of the substrate when the substrate is supported on the support surface. The groove has a depth of at least 25% of the thickness of the substrate holder.

In another aspect, an apparatus for processing a substrate is provided. The apparatus comprises a substrate holder having a thickness defined as a distance between generally parallel top and bottom surfaces of the substrate holder. The substrate holder has a support surface sized to extend underneath and support a substrate of a particular size in a support plane. The substrate holder has a plurality of annular grooves that surround the support surface. Each of the grooves has a depth of at least 25% of the thickness of the substrate holder.

In another aspect, an apparatus for processing a substrate is provided. The apparatus comprises a substrate holder having a thickness defined as a distance between generally parallel top and bottom surfaces of the substrate holder. The substrate holder has a support surface sized to support a substrate of a particular size in a support plane. The substrate holder has an annular groove sized to surround an outer edge of the substrate when the substrate is supported on the support surface. The groove has a depth of at least 1.5 mm.

In another aspect, a method of manufacturing an apparatus for processing a substrate is provided. A substrate holder is formed having a thickness defined as a distance between generally parallel top and bottom surfaces of the substrate holder. The substrate holder has one or more support elements configured to support a substrate of a particular size in a support plane defined by the one or more support elements. A first annular groove is formed in the substrate holder. The groove is configured to surround an outer edge of the substrate when the substrate is supported on the one or more support elements. The groove has a depth of at least 25% of the thickness of the substrate holder.

In yet another aspect, a method of manufacturing an apparatus for processing a substrate is provided. According to the method, a substrate holder is formed having a thickness defined as a distance between generally parallel top and bottom surfaces of the substrate holder. The substrate holder has a support surface configured to extend under and support a substrate of a particular size in a support plane defined by the substrate holder. One or more annular grooves are formed in the substrate holder, each of which surrounds the support surface. The grooves each have a depth of at least 25% of the thickness of the substrate holder.

In yet another aspect, a method of manufacturing an apparatus for processing a substrate is provided. According to the method, a substrate holder is formed having a thickness defined as a distance between generally parallel top and bottom surfaces of the substrate holder. The substrate holder has one or more support elements configured to support a substrate of a particular size in a support plane defined by the one or more support elements. A first annular groove is formed in the substrate holder. The groove is configured to surround an outer edge of the substrate when the substrate is supported on the one or more support elements. The groove has a depth of at least 1.5 mm.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

Further features and advantages of the present invention will become apparent from the detailed description of preferred embodiments that follow, when considered together with the attached drawings, which are intended to illustrate and not to limit the invention.

DETAILED DESCRIPTION OF THE PREFERRED EMBODIMENT

As noted above in the Background section, processed substrates are typically characterized by an exclusion zone at the outer radial portion of each substrate, within which the deposited film has non-uniform qualities. This is due in part to the substrate holder upon which the substrate is supported. The outer radial portion of a typical substrate holder loses convective heat at a greater rate than the remainder of the holder. This is because the outer radial portion has a larger surface area at which heat loss can occur. The outer radial edge also loses some conductive heat due to contact with other equipment. In addition, in most existing apparatuses the vertical side edge of the holder receives less direct radiant heat than the remainder of the holder. As a result, the outer radial portion of the substrate holder has a lower temperature than the remainder of the holder, which in turn results in the aforementioned non-uniformities in the outer radial portion of the processed substrate.

Figure 1B:
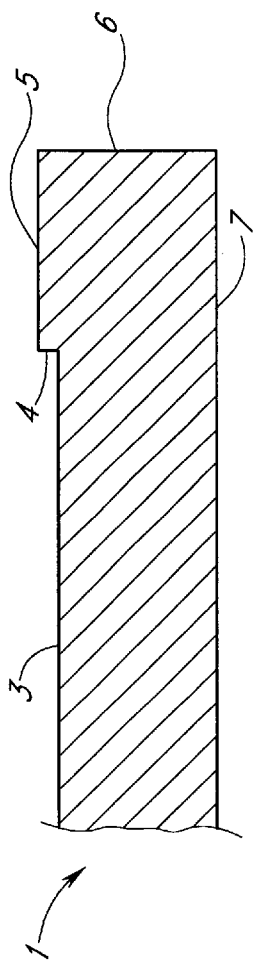
FIG. 1B is a partial cross-sectional view of the substrate holder of FIG. 1A, taken along line 1B—1B of FIG. 1A.
Figure 1C:
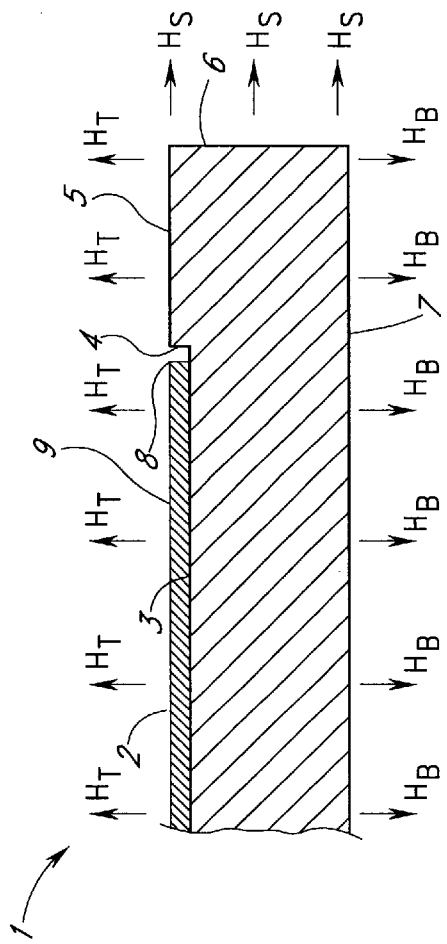
FIG. 1C is a partial cross-sectional view of the substrate holder of FIGS. 1A and 1B, shown with a substrate held thereon.
Figure 1A:
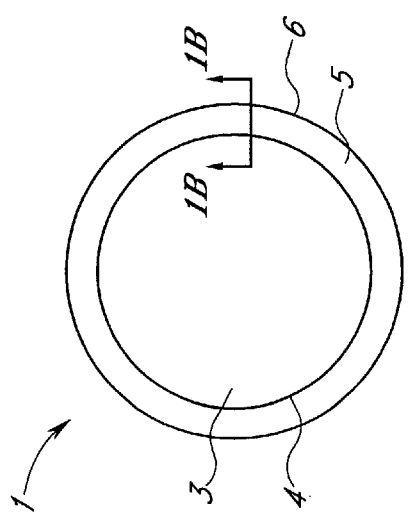
FIG. 1A is a top plan view of a conventional substrate holder.

FIGS. 1A–1D illustrate this concept. FIGS. 1A–1C show a conventional substrate holder 1 for supporting a substrate 2, such as a semiconductor wafer, during processing. FIGS. 1A and 1B show the substrate holder 1 alone without the substrate 2. FIG. 1A is a top plan view, and FIG. 1B is a cross-sectional view of one side of the holder 1. FIG. 1C is a view similar to that of FIG. 1B, showing a substrate 2 supported on the holder 1. The holder 1 includes an inner circular pocket area 3 defined by an annular wall 4. The pocket area 3 is sized and configured to receive and support the substrate 2. The wall 4 separates the pocket area 3 from a raised annular shoulder 5. The shoulder 5 is located radially outward of the pocket 3. The holder 1 has an annular side surface 6 and a bottom surface 7.

During substrate processing, the substrate holder 1 absorbs heat, typically from radiant heat lamps surrounding the reaction chamber. The substrate holder 1 also loses heat to the surrounding environment (e.g., to the chamber walls, which are not perfectly reflective). Some of this lost heat is re-radiated from the holder 1, while the rest is lost by convection and conduction. With reference to FIG. 1C, the holder 1 loses heat from its upper surfaces 3 and 5, side surface 6, and bottom surface 7, and the substrate 2 loses heat from its upper surface 9. The arrows $H_T$ schematically illustrate the heat lost at the upper surfaces 3, 5, and 9. Similarly, the arrows $H_S$ and $H_B$ schematically illustrate the heat loss at the side surface 6 and the bottom surface 7, respectively. Throughout most of the holder/substrate combination, the heat loss $H_T$ and $H_B$ is typically compensated with uniform heat input across the combination surface. Thus, there is a relatively uniform temperature throughout the upper surface of the holder/substrate combination (there may be some vertical temperature gradients). However, there is additional heat loss $H_S$ at the outer radial edge of the holder/substrate combination, which receives less direct radiation and is thus not compensated by heat input. This results in a low temperature at the outer radial edge of the holder 1 and substrate 2. Consequently, this substrate holder design normally results in some degree of processing non-uniformities within an "exclusion zone" bordering the substrate edge 8. Furthermore, the additional heat loss at the edges induces temperature gradients from the wafer center to the edges, as heat flows in that direction.

Figure 1D:
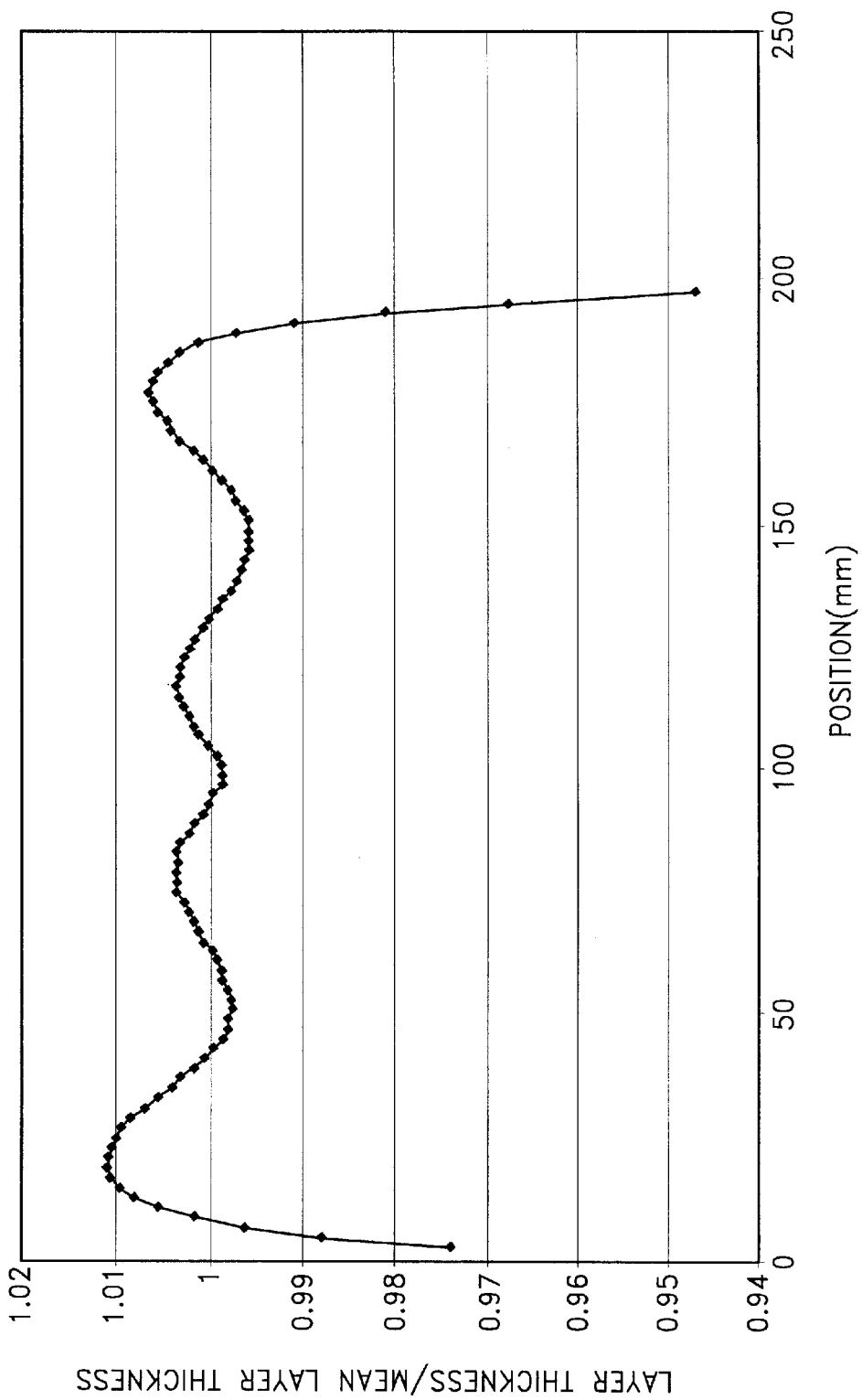
FIG. 1D is a graph illustrating the thickness of a deposited chemical layer across the surface of a semiconductor substrate, using a conventional substrate holder.

FIG. 1D is a graph that illustrates the thickness of a chemical deposition layer across the surface of a 200-mm semiconductor substrate, using a conventional substrate holder such as the holder 1 shown in FIGS. 1A–C. This test was conducted on a rotating substrate (i.e., the substrate was rotated about its vertical center axis). In FIG. 1D, the horizontal axis represents the horizontal location on the surface of the substrate. The value 0 mm represents the leading edge of the substrate, and 200 mm represents the trailing edge. The vertical axis represents the localized layer thickness divided by the mean layer thickness throughout the surface of the substrate. The localized layer thickness of the chemical deposition layer is shown only from 3–197 mm on the horizontal axis. This is because it is very difficult to measure the thickness of the chemical deposition layer within the three millimeters bordering the substrate edge, which is often rounded. As shown in FIG. 1D, the use of a conventional substrate holder leads to a significant reduction of the thickness of the chemically deposited layer at the edges of the substrate. This "exclusion zone" is caused by the lower temperature at the outer radial edge of the substrate/holder combination.

The present invention helps to reduce the size of the exclusion zone. A substrate holder design that significantly reduces heat losses at the outer radial edge of the holder/substrate combination and, thus, helps to shrink the size of the exclusion zone is provided. Before presenting the details of a preferred embodiment of the substrate holder of the invention, it will be instructive to illustrate an exemplary reactor within which the inventive holder can be used for processing substrates, such as semiconductor wafers.

Figure 2:
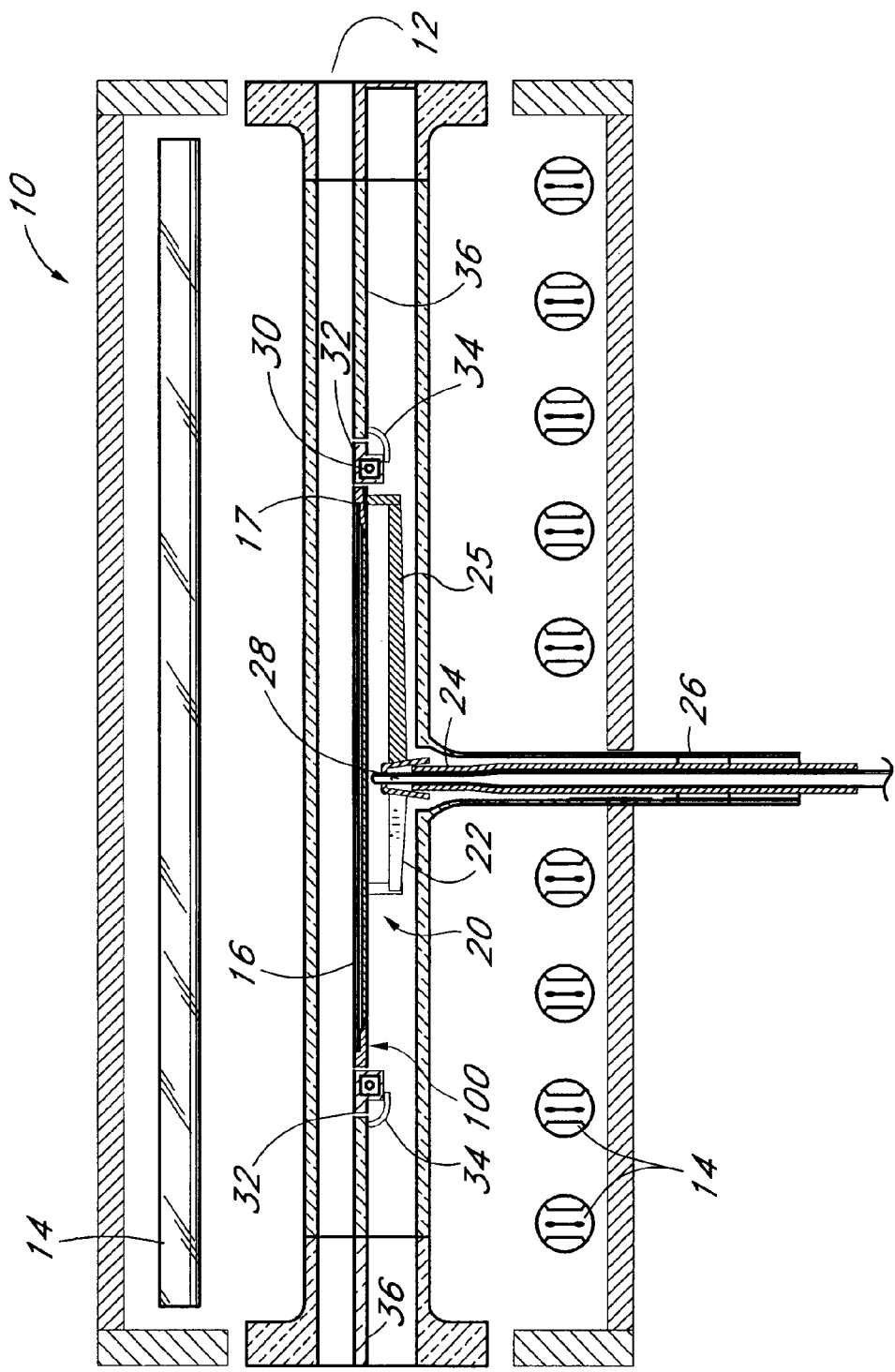
FIG. 2 is a schematic, cross-sectional view of an exemplary reaction chamber with a substrate supported on a substrate holder therein.

FIG. 2 illustrates an exemplary chemical vapor deposition (CVD) reactor 10, including a quartz reaction chamber 12. Radiant heating elements 14 are supported outside the quartz chamber 12, to provide heat energy to the chamber 12 without appreciable absorption by the chamber walls. Although the preferred embodiments are described in the context of a "cold wall" CVD reactor, it will be understood that the substrate support systems described herein can be used in other types of reactors and semiconductor processing equipment. Skilled artisans will appreciate that the claimed invention is not limited to use within the particular reactor 10 disclosed herein. In particular, one of skill in the art can find application for the substrate support systems described herein for other semiconductor processing equipment, wherein a substrate is supported while being uniformly heated or cooled, particularly where the support is subject to edge losses near the substrate edge. Moreover, while illustrated in the context of standard silicon wafers, the supports described herein can be used to support other kinds of substrates, such as glass, which are subjected to treatments such as CVD, physical vapor deposition (PVD), etching, annealing, dopant diffusion, photolithography, etc. The supports are of particular utility for supporting substrates during treatment processes at elevated temperatures.

The illustrated substrate comprises a semiconductor wafer 16 with a generally circular edge 17, shown in FIG. 2 supported within the reaction chamber 12 upon a substrate support structure 20. The illustrated support structure 20 includes a substrate holder 100, upon which the wafer 16 rests, and a spider 22 that supports the holder 100. The substrate holder 100, shown in greater detail in FIGS. 3A–3B (described below), is only one of a number of preferred embodiments of the present invention. The spider 22 is preferably made of a transparent and non-metallic (to reduce contamination) material. The spider 22 is mounted to a shaft 24, which extends downwardly through a tube 26 depending from the lower wall of the chamber 12. The spider 22 has at least three substrate holder supporters or arms 25, which extend radially outward and upward from the shaft 24. The arms 25 are preferably separated by equal angles about a vertical center axis of the shaft 24, which is preferably aligned with a vertical center axis of the holder 100 and wafer 16. For example, if there are three arms 25, they are preferably separated from one another by 120°. The arms 25 are configured to support the bottom surface of the holder 100. In a preferred embodiment, the substrate holder 100 comprises a susceptor capable of absorbing radiant energy from the heating elements 14 and re-radiating such energy. It is preferable that the upper surface of the holder 100 is solid and made of one piece. Preferably, the shaft 24, spider 22, and holder 100 are configured to be rotated in unison about a vertical center axis during substrate processing.

A central temperature sensor or thermocouple 28 extends through the shaft 24 and the spider 22 in proximity to the substrate holder 100. Additional peripheral thermocouples 30 are also shown housed within a slip ring or temperature compensation ring 32, which surrounds the substrate holder 100 and the wafer 16. The thermocouples 28, 30 are connected to a temperature controller (not shown), which sets the power of the various heating elements 14 in response to the readings of the thermocouples 28, 30.

In addition to housing the thermocouples 30, the slip ring 32 absorbs radiant heat during high temperature processing. As noted in the Background section, the heated slip ring 32 helps to reduce, but not eliminate, heat loss at the wafer edge 17. The slip ring 32 can be suspended by any suitable means. For example, the illustrated slip ring 32 rests upon elbows 34, which depend from the quartz chamber dividers 36.

Figure 3A:
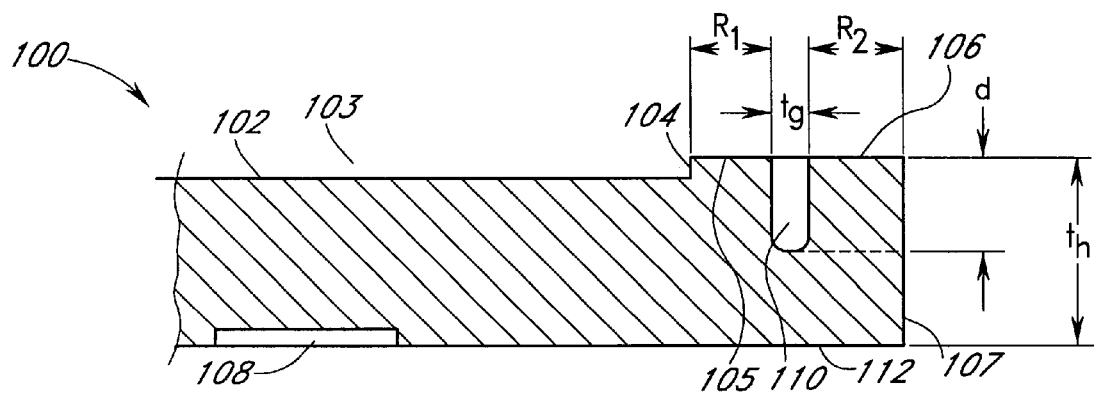
FIG. 3A is a partial cross-sectional view of a substrate holder according to one embodiment of the present invention, having an annular groove extending downward from an upper surface of the holder.
Figure 3B:
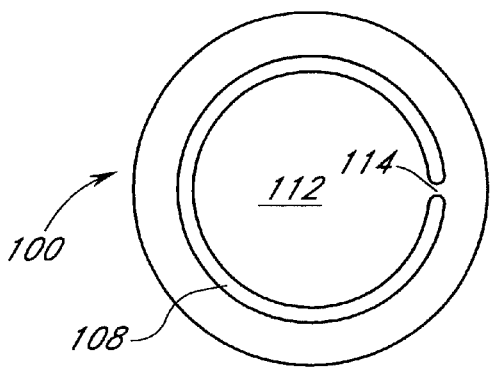
FIG. 3B is a bottom plan view of the substrate holder of FIG. 3A.

FIGS. 3A and 3B show in greater detail the substrate holder 100, which is one preferred embodiment. As noted above, the substrate holder 100 is preferably a susceptor capable of absorbing and re-radiating radiant energy. The holder 100 is preferably made of graphite coated with silicon carbide, although the skilled artisan will appreciate that other materials are also suitable. The illustrated holder 100 is a type considerably more massive than the substrate to be supported, preferably more than 5 times and more preferably between about 7 and 9 times the thermal mass of the substrate, such that it can serve as a "thermal flywheel" to maintain temperature stability.

FIG. 3A shows a partial cross-section of the substrate holder 100. The holder 100 includes a contiguous, substantially flat surface 102 configured to support a substrate of a particular size in a support plane defined by the surface 102. The illustrated holder 100 includes an annular wall 104 that defines a substrate support pocket 103 radially inward of the wall 104. The surface 102 defines the bottom of the pocket 103. The pocket 103 is configured to receive a substrate supported on the surface 102. Preferably, the dimensions of the wall 104 are such that it closely surrounds the substrate. An annular raised shoulder 105 surrounds the wall 104 and pocket 103 and has a top surface 106. The holder 100 has an annular peripheral side surface 107 and a bottom surface 112. Preferably, the substrate support surface 102 is substantially parallel to the top surface 106 of the shoulder 105. Preferably, the pocket 103, wall 104, shoulder 105, and side surface 107 are circular. The holder 100 has a bottom surface 112 that is preferably at least generally parallel with the surface 106. The substrate holder has a thickness $t_h$ defined as the distance between the surfaces 106 and 112.

In its bottom surface 112, the illustrated substrate holder 100 includes a preferably circular bottom groove 108 centered about a central vertical axis of the holder 100. The bottom groove 108 is configured to receive upper ends of the substrate holder supporters or arms 25 of the spider 22 (FIG. 2). FIG. 3B, which shows a bottom plan view of the holder 100, illustrates a preferred configuration of the bottom groove 108. The illustrated bottom groove 108 does not form a complete circle but is interrupted by a section 114, shown on the right side of FIG. 3B. The interrupting section 114 ensures that the spider 22 cannot rotate independently of the holder 100 once it has locked in position against section 114. A more detailed description of a bottom groove such as bottom groove 108 is provided in U.S. patent application Ser. No. 09/747,173. In an alternative embodiment, the substrate holder does not have a bottom groove. Instead, the holder has a plurality of recesses, each configured to closely receive one of the upper ends of the substrate holder supporters 25 of the spider 22.

With reference to FIGS. 2 and 3A, the substrate holder 100 has a generally vertical annular groove 110 configured to surround the outer edge 17 of the wafer when the wafer 16 is supported on the surface 102 of the holder. The vertical annular groove 110 inhibits the flow of heat radially outward through the holder 100. By doing so, the vertical annular groove 110 reduces the heat loss from the peripheral side surface 107 of the holder 100. In the illustrated embodiment, the vertical annular groove 110 is located in the shoulder 105, radially outward of the wall 104. Preferably, the vertical annular groove 110 extends downward from an upper surface of the holder 100, such that the vertical annular groove 110 is open at an upper side of the holder. For example, in the illustrated embodiment the vertical annular groove 110 extends downward from the surface 106. In other embodiments, the vertical annular groove 110 extends upward from a lower surface of the holder 100, such that it is open at a lower side of the holder. For example, the illustrated embodiment can be modified so that the vertical annular groove 110 extends upward from the bottom surface 112. While the illustrated groove 110 is vertical, those of ordinary skill in the art will understand that the groove 110 can have many different, possibly irregular shapes.

With continued reference to FIG. 3A, the vertical annular groove 110 of the substrate holder 100 reduces heat loss from the peripheral side surface 107 by forming an impediment to radial heat flow from the center region of the holder 100 to the side surface 107. The vertical annular groove 110 has an annular thickness $t_g$ (along a radial direction for the illustrated round substrate holder). In a preferred embodiment, the thickness $t_g$ is generally uniform. In other embodiments, the thickness $t_g$ varies along its length. Preferably, the annular thickness $t_g$ is large enough to substantially reduce the flow of heat radially outward through the holder 100, and to permit the application of a complete coating of silicon carbide over the entire inner surface of the vertical annular groove 110. The annular thickness $t_g$ is also preferably small enough to prevent significant flow of gas, and thus convective heat loss, within the vertical annular groove 110. Also, the skilled artisan will understand that as the annular thickness $t_g$ becomes larger, the structural integrity of the holder 100 becomes more compromised, particularly during the silicon carbide coating process during manufacture of the holder, which warps the holder shape. The average annular thickness $t_g$ of the groove 110 is preferably less than 3.0 mm, more preferably less than 2.0 mm, and more preferably less than 1.5 mm.

As shown in FIG. 3A, the vertical annular groove 110 has a vertical depth d, defined as the vertical distance between the top and bottom points of the vertical annular groove 110. Preferably, the depth d is large enough to substantially reduce the flow of heat radially outward through the holder 100, while also small enough to prevent significant compromise of the structural integrity of the holder. The depth d is preferably at least 25%, more preferably at least 50%, more preferably at least 60%, and even more preferably at least 70% of the thickness $t_h$ of the holder 100. In one embodiment, the depth d is preferably at least 1.5 mm, more preferably at least 3.0 mm, and even more preferably at least 4.0 mm.

As shown in FIG. 3A, the vertical annular groove 110 is spaced an annular distance $R_1$ from the wall 104, and an annular distance $R_2$ from the peripheral side surface 107 of the substrate holder 100. Suppose $R_{TOTAL}$ is the annular thickness of the shoulder 5, which is equal to $R_1+t_g+R_2$. In a preferred embodiment, following constraints are met:

$R_1/R_{TOTAL}>0.1$ $R_2/R_{TOTAL}>0.1$

Figure 4:
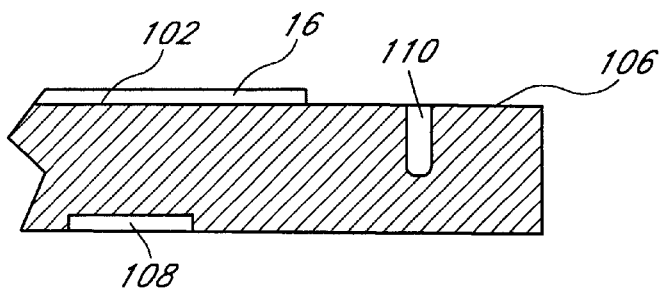
FIG. 4 is a partial cross-sectional view of a substrate holder according to another embodiment of the present invention, having a flat upper surface and no substrate support pocket.

FIG. 4 shows an alternative embodiment of the substrate holder 100, in which the wall 104 and pocket 103 are omitted, such that the substrate support surface 102 is generally coplanar with the shoulder 106. In this alternative embodiment, the upper surface of the holder is preferably substantially flat. For clarity, a semiconductor substrate or wafer 16 is shown supported on the holder 100. The skilled artisan will appreciate that other configurations are possible. For example, the substrate support surface can be above the outer shoulder of the substrate holder.

U.S. patent application Ser. No. 09/747,173 discloses a substrate holder designed to minimize problems associated with substrate "slide," "stick," and "curl." Slide occurs when the substrate is dropped onto the substrate holder from above. Slide is normally caused by a cushion of gas above the holder (e.g., in a recess or pocket sized to receive a substrate), which is unable to escape fast enough to allow the substrate to fall immediately onto the holder. The substrate floats momentarily above the holder as the gas slowly escapes, causing the substrate to slide off center. Conversely, stick is the tendency of the substrate to sling to the substrate holder during substrate pickup. Stick occurs because gas is slow to flow into the small space between the substrate and the holder, creating a vacuum effect therebetween. Curl refers to warping of the substrate caused by a combination of both radial and axial temperature gradients therein. Typically, when a substrate is initially inserted into a heated reaction chamber and held above a substrate holder, the center of the substrate is heated disproportionately from below, causing the substrate to curl slightly into a "bowl" or concave-up shape. When the slightly curled substrate is dropped onto a hot wafer holder that does not conform in shape to the substrate (e.g., a flat holder), the curl can be greatly exacerbated. Slide and curl often lead to non-uniformities in processed substrates, and stick can cause particle contamination in the reaction chamber.

The wafer holder disclosed in U.S. patent application Ser. No. 09/747,173 substantially prevents substrate slide and stick by providing a plurality of intersecting grooves underneath the substrate, which permit the flow of gas to and from the region between the substrate and the holder. In addition, substrate curl is substantially minimized by providing a slight concavity in the upper surface of the holder, so that the holder more closely conforms in shape to the slightly curled substrate. The embodiments of the present invention discussed below and shown in FIGS. 5A–C and 6 represent further modifications of the substrate holder of U.S. patent application Ser. No. 09/747,173. In these embodiments, a deep annular groove, such as the groove 110 of FIG. 3A, is provided to prevent the radial flow of heat to the annular peripheral side surface of the holder.

Figure 5B:
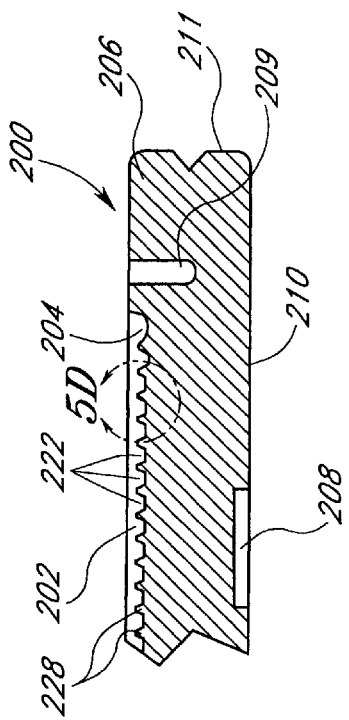
FIG. 5B is a partial cross-sectional view of the substrate holder of FIG. 5A, taken along line 5B—5B.
Figure 5D:
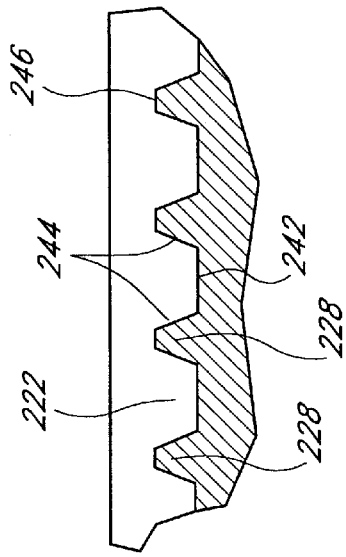
FIG. 5D is an enlarged view of a portion of FIG. 5B indicated by arrows 5D—5D.
Figure 5A:
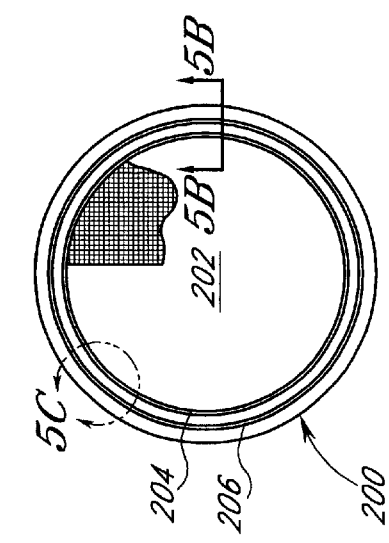
FIG. 5A is a top plan view of a substrate holder according to another embodiment of the present invention, in which the holder has a gridded substrate support surface defined by intersecting grooves.
Figure 5C:
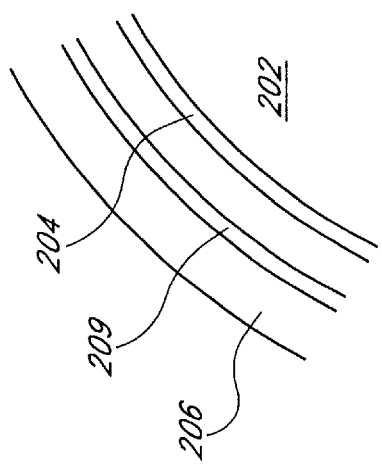
FIG. 5C is an enlarged view of a portion of FIG. 5A indicated by arrows 5C—5C.

FIGS. 5A–D show a substrate holder 200 according to another embodiment. The holder 200, preferably a susceptor, has features similar to the holder disclosed in U.S. patent application Ser. No. 09/747,173. In addition, the holder 200 has a deep annular groove 209 (similar to the vertical annular groove 110 described above) to prevent the radial flow of heat to the annular peripheral side surface of the holder. The holder 200 can effectively replace the substrate holder 100 (FIGS. 3A and 3B) inside the reactor 10 of FIG. 2. FIG. 5A shows the holder 200 as viewed from the top, that is, looking into a recessed pocket 202 in which a substrate will be supported. The holder 200 is similar to the previously described holder 100, with the exception that the holder 200 has intersecting grooves 222 (FIG. 5B) cut into its upper surface and surrounded by a shallow annular groove 204. The shallow annular groove 204 resides radially inward of the deep annular groove 209. The intersecting grooves 222 comprise two sets of parallel grooves that intersect each other. The intersecting grooves 222 define a plurality of grid protrusions 228 (FIG. 5B). The tops 246 (FIG. 5D) of the protrusions 228 along at least the circumference closest to the edge of the pocket 202 define a support plane within which the substrate rests. The intersecting grooves 222 are thus below this support plane. A raised shoulder 206 surrounds the shallow annular groove 204. The holder 200 has an annular peripheral side surface 211. FIG. 5C is an enlarged view of a portion of FIG. 5A, illustrating more clearly the configuration of the grooves 204 and 209 and shoulder 206 of the holder 200.

FIG. 5B is a cross-sectional view of an area near the periphery of the wafer holder 200 along the line 5B—5B in FIG. 5A. As mentioned above, the top surface of the pocket 202 has a plurality of grid protrusions 228 separated by a plurality of parallel grooves 222, perpendicular to the plane of the page. The skilled artisan will appreciate that there is a second set of similar, parallel grooves (not visible in this view), perpendicular to the illustrated grooves 222 and parallel to the plane of the page. Thus, the protrusions 228 can be understood as small, truncated pyramid islands, bordered on two parallel sides by one set of grooves 222 and on the other two parallel sides by the second set of grooves not seen in this view. The shallow annular groove 204, the raised shoulder 206, and the deep annular groove 209 are also shown. The skilled artisan will understand that the intersecting grooves 222 that define the protrusions 228 need not be perpendicular. On a bottom surface 210, the holder 200 has a bottom groove 208 similar to the bottom groove 108 shown in FIG. 3B. In one embodiment, the tops 246 of the protrusions 228 are substantially coplanar. In another embodiment, shown more clearly in FIG. 6, the tops 246 of the protrusions 228 collectively form a concave surface that minimizes problems associated with substrate curl. Preferred dimensions of the pocket 202, shallow annular groove 204, intersecting grooves 222, protrusions 228, and shoulder 206 are disclosed in U.S. patent application Ser. No. 09/747, 173.

FIG. 5D is an enlarged view of a portion of FIG. 5B, illustrating more clearly a preferred configuration of the grid protrusions 228 of the substrate holder 200. FIG. 5D is a detail of the pocket 202 surface shown in the circle labeled 5D in FIG. 5B. Each grid groove 222 has a flat grid floor or bottom 242 and sidewalls 244 that slant outward. The protrusions 228 between the grooves 222 have flat tops 246 that define the support surface of the pocket 202. In the illustrated embodiment, the tops 246 are square.

The wafer holder 200 of FIGS. 5A–D includes a deep vertical annular groove 209 similar to the above-described vertical annular groove 110 shown in FIG. 3A. The deep annular groove 209 substantially reduces the radial flow of heat from the center region of the holder 200 to the peripheral side surface 211. The depth of the deep annular groove 209 is preferably at least 25%, more preferably at least 50%, more preferably at least 60%, and even more preferably at least 70% of the thickness of the holder 200. Preferably, the depth, annular thickness, and position of the deep annular groove 209 of the holder 200 are as described above for the groove 110 of the holder 100 of FIGS. 3A and 3B.

Figure 6:
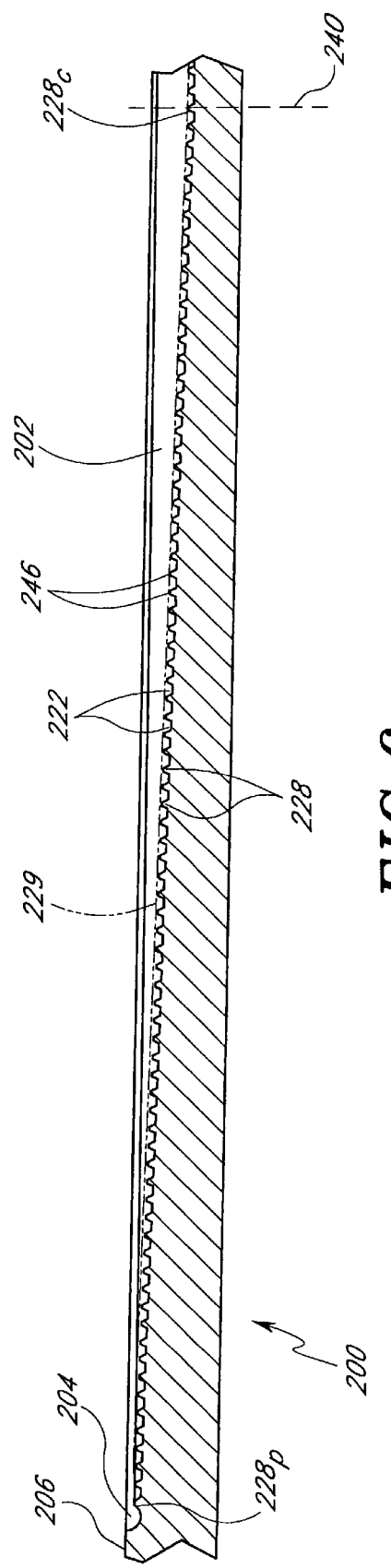
FIG. 6 is a schematic cross-sectional view of a portion of a substrate holder according to another embodiment of the present invention, the substrate support surface being concave.

In a preferred embodiment, the substrate holder of the invention includes a generally concave surface below the support plane within which the substrate is supported, in order to minimize problems associated with substrate curl. For example, FIG. 6 shows a cross-sectional view of an embodiment of the substrate holder 200 of FIGS. 5A–C in which the holder includes a concave surface 229 comprising top surfaces 246 of the protrusions 228 defined by the plurality of intersecting grooves 222. The view extends from a vertical center axis 240 of the holder to the annular raised shoulder 206. Only a portion of the shoulder 206 is shown. The surface 229 slopes gradually downward from a peripheral protrusion $228_p$ to a center protrusion $228_c$. Although it is not shown, it will be understood that the surface 229 also slopes upward from the center protrusion $228_c$ to another peripheral protrusion on the opposite side of the pocket 202. The pocket 202 thus has circular symmetry, forming an overall concave shape. However, the skilled artisan will appreciate that non-circular shapes can be provided as well. A substrate is supported by the peripheral protrusions $228_p$ near the periphery of the pocket 202 adjacent the shallow annular groove 204. In FIG. 6, the concavity and grid structure have been exaggerated for the purpose of illustration. Preferred dimensions of the pocket 202, shallow annular groove 204, intersecting grooves 222, protrusions 228, shoulder 206, and concavity 229 are disclosed in U.S. patent application Ser. No. 09/747,173.

Figure 7:
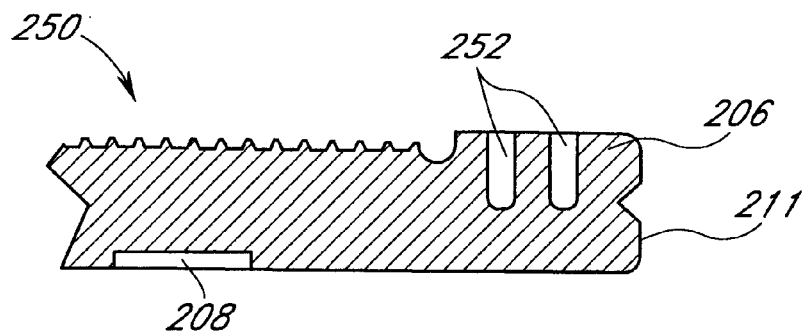
FIG. 7 is a partial cross-sectional view of a portion of a substrate holder according to another embodiment of the present invention, having multiple annular grooves open to an upper side of the holder.

FIG. 7 shows a partial cross-section of a substrate holder 250 according to another embodiment. The illustrated holder 250 is similar in most respects to the holder 200 of FIGS. 5A–D. The holder 250 differs from the holder 200 in that, instead of a single deep annular groove 209, the holder 250 includes a plurality of deep annular grooves 252 that are open to the upper side of the holder. In the illustrated embodiment, the holder 250 includes two deep annular grooves 252. However, the skilled artisan will appreciate that any number of deep annular grooves 252 can be provided within the available radial thickness of the annular shoulder 206. It will also be understood that any of the herein disclosed embodiments of substrate holders of the invention can be modified to have two or more deep annular grooves 252 as shown in FIG. 7. Advantageously, multiple deep annular grooves 252 serve to further reduce the radial heat flow to the annular side surface 211 of the holder 250 and, thus, further decrease heat loss at the edge of the holder.

Figure 8:
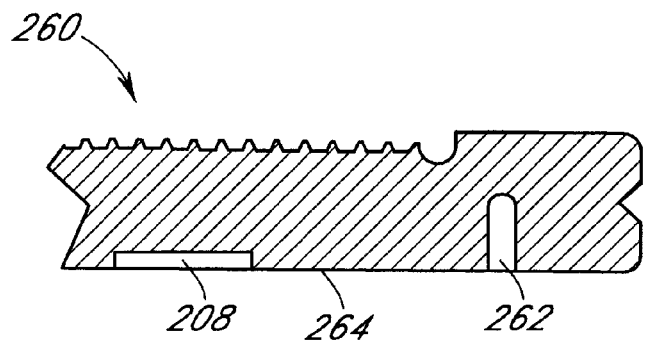
FIG. 8 is a partial cross-sectional view of a portion of a substrate holder according to another embodiment of the present invention, having an annular groove open to a lower side of the holder.

FIG. 8 shows a partial cross-section of a substrate holder 260 according to another embodiment. The illustrated holder 260 is similar in most respects to the holder 200 of FIGS. 5A–D. The holder 260 differs from the holder 200 in that, instead of a single deep annular groove 209 open to the upper side of the holder, the holder 250 has a single deep annular groove 262 open to the lower side 264 of the holder. Any of the embodiments of substrate holders of the invention can be modified to have one or more deep annular grooves 262 open to the lower side of the holder, as shown in FIG. 8.

Figure 9:
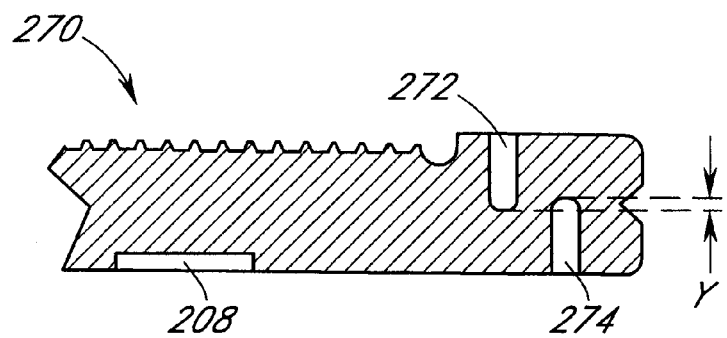
FIG. 9 is a partial cross-sectional view of a portion of a substrate holder according to another embodiment of the present invention, having multiple annular grooves open to upper and lower sides of the holder.

FIG. 9 shows a partial cross-section of a substrate holder 270 according to yet another embodiment of the present invention. The illustrated holder 270 is similar in most respects to the holder 200 of FIGS. 5A–D. The holder 270 differs from the holder 200 in that, instead of a single deep annular groove 209 open to the upper side of the holder, the holder 250 has one or more deep annular grooves 272 open to the upper side of the holder, as well as one or more deep annular grooves 274 open to the lower side of the holder. In this configuration, the deep annular grooves 272 and 274 further reduce radial heat flow to the annular side surface 211 of the holder 270. Preferably, the deep annular grooves 272 and 274 overlap vertically, which more effectively impedes radial heat flow across the entire height of the holder 270. In the illustrated embodiment, the deep annular grooves 272 and 274 overlap vertically by a distance y. The overlap y is preferably large enough to maximize the ability of the deep annular grooves to impede radial heat flow through the holder, yet not so large as to compromise the structural integrity of the holder 270. In one embodiment, the overlap y is preferably at least 1.0 mm, more preferably at least 2.0 mm, but preferably no more than 5.0 mm. While the illustrated holder 270 includes only one deep annular groove 272 open to the upper side of the holder and only one deep annular groove 274 open to the lower side of the holder, the skilled artisan will appreciate that nay number of deep annular grooves 272 and 274 can be provided. Any of the embodiments of substrate holders of the invention can be modified to have any number of deep annular grooves 272 and 274 as shown in FIG. 9.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Further, the various features of this invention can be used alone, or in combination with other features of this invention other than as expressly described above. Thus, it is intended that the scope of the present invention herein disclosed should not be limited by the particular disclosed embodiments described above, but should be determined only by a fair reading of the claims that follow.

We claim:

1. An apparatus for processing a substrate, the apparatus comprising a substrate holder having a thickness defined as a distance between generally parallel top and bottom surfaces of the substrate holder, the substrate holder having one or more support elements configured to support a substrate of a particular size in a support plane defined by the one or more support elements, the substrate holder having an annular groove configured to surround an outer edge of the substrate when the substrate is supported on the one or more support elements, the annular groove having a depth of at least 25% of the thickness of the substrate holder.

2. The apparatus of claim 1, wherein the groove is generally vertical.

3. The apparatus of claim 1, wherein the groove extends generally downward from the top surface of the substrate holder.

4. The apparatus of claim 1, wherein the groove extends generally upward from the bottom surface of the substrate holder.

5. The apparatus of claim 1, wherein the groove is open at an upper side of the substrate holder.

6. The apparatus of claim 1, wherein the groove is open at a lower side of the substrate holder.

7. The apparatus of claim 1, wherein the depth of the groove is at least 50% of the thickness of the substrate holder.

8. The apparatus of claim 1, wherein the depth of the groove is at least 60% of the thickness of the substrate holder.

9. The apparatus of claim 1, wherein the depth of the groove is at least 70% of the thickness of the substrate holder.

10. The apparatus of claim 1, wherein the substrate holder has a circular outer periphery and is configured to support a circular substrate, the groove being generally circular.

11. The apparatus of claim 1, wherein the one or more support elements comprise a plurality of protrusions defined by a plurality of intersecting grooves below the support plane.

12. The apparatus of claim 1, wherein the one or more support elements consist of a contiguous substantially flat surface.

13. The apparatus of claim 1, wherein the substrate holder includes an annular wall that defines a substrate support pocket radially inward of the wall, the substrate support pocket configured to receive the substrate supported on the one or more support elements, the groove located radially outward of the wall.

14. The apparatus of claim 13, wherein the wall is circular.

15. The apparatus of claim 1, wherein the substrate holder is a susceptor.

16. The apparatus of claim 1, wherein the substrate holder is configured to be supported by a spider structure comprising a vertical shaft and at least three substrate holder supporters extending radially outward and upward from the shaft, the substrate holder supporters configured to support the bottom surface of the substrate holder.

17. The apparatus of claim 16, wherein the bottom surface of the substrate holder includes a plurality of recesses configured to receive upper ends of the substrate holder supporters of the spider structure.

18. The apparatus of claim 16, wherein the bottom surface of the substrate holder includes a circular groove centered above a central vertical axis of the substrate holder, the circular groove configured to receive upper ends of the substrate holder supporters of the spider structure, the circular groove of the bottom surface being interrupted in one location.

19. The apparatus of claim 1, wherein the groove has an average annular thickness less than 3.0 mm.

20. The apparatus of claim 1, wherein the groove has an average annular thickness less than 1.5 mm.

21. The apparatus of claim 1, wherein the groove has a generally uniform annular thickness.

22. The apparatus of claim 1, wherein the substrate holder includes a generally concave-up surface below the support plane.

23. The apparatus of claim 22, wherein the concave-up surface comprises top surfaces of protrusions defined by a plurality of intersecting grooves in the substrate holder.

24. The apparatus of claim 1, wherein the support plane is generally coplanar with or below the top surface of the substrate holder.

25. The apparatus of claim 1, further having one or more additional annular grooves configured to surround the outer edge of the substrate when the substrate is supported on the one or more support elements, each of the one or more additional grooves having a depth of at least 25% of the thickness of the substrate holder.

26. An apparatus for processing a substrate, comprising:
   a reaction chamber;
   a plurality of heating elements configured to heat the reaction chamber; and
   a substrate holder in the reaction chamber, the substrate holder having a thickness defined as a distance between generally parallel top and bottom surfaces of the substrate holder, the substrate holder having one or more support elements configured to support a substrate of a particular size within a support plane defined by the one or more support elements, the substrate holder having an annular groove configured to surround an outer edge of the substrate when the substrate is supported on the one or more support elements, the groove having a depth of at least 25% of the thickness of the substrate holder.

27. The apparatus of claim 26, wherein the groove is generally vertically oriented.

28. The apparatus of claim 26, wherein the support plane is no higher than the top surface of the substrate holder.

29. The apparatus of claim 26, further comprising a support structure configured to support the substrate holder, the support structure comprising a vertical shaft and a plurality of support arms extending generally radially outward and upward from the shaft, the support arms having upper ends configured to support the substrate holder.

30. An apparatus for processing a substrate, the apparatus comprising a substrate holder having a thickness defined as a distance between generally parallel top and bottom surfaces of the substrate holder, the substrate holder having a support surface sized to support a substrate of a particular size in a support plane, the substrate holder having an annular groove sized to surround an outer edge of the substrate when the substrate is supported on the support surface, the groove having a depth of at least 25% of the thickness of the substrate holder.

31. The apparatus of claim 30, wherein the support surface consists of a single substantially flat and contiguous surface.

32. The apparatus of claim 30, wherein the support surface comprises top surfaces of protrusions defined by intersecting grooves in a surface of the substrate holder.

33. The apparatus of claim 30, wherein the support surface comprises the periphery of a concave surface of the substrate holder.

34. The apparatus of claim 33, wherein the support surface comprises top surfaces of protrusions defined by intersecting grooves in the concave surface.

35. The apparatus of claim 30, wherein the groove is open at one of the top and bottom surfaces of the substrate holder.

36. An apparatus for processing a substrate, the apparatus comprising a substrate holder having a thickness defined as a distance between generally parallel top and bottom surfaces of the substrate holder, the substrate holder having a support surface sized to extend underneath and support a substrate of a particular size in a support plane, the substrate holder having a plurality of annular grooves that surround the support surface, each of the grooves having a depth of at least 25% of the thickness of the substrate holder.

37. The apparatus of claim 36, wherein a first of the grooves is open to an upper side of the substrate holder.

38. The apparatus of claim 37, wherein a second of the grooves is open to a lower side of the substrate holder.

39. The apparatus of claim 37, wherein a second of the grooves is open to the upper side of the substrate holder.

40. The apparatus of claim 36, wherein a first of the grooves is open to a lower side of the substrate holder.

41. The apparatus of claim 40, wherein a second of the grooves is open to an upper side of the substrate holder.

42. The apparatus of claim 40, wherein a second of the grooves is open to the lower side of the substrate holder.

43. An apparatus for processing a substrate, the apparatus comprising a substrate holder having a thickness defined as a distance between generally parallel top and bottom surfaces of the substrate holder, the substrate holder having a support surface sized to support a substrate of a particular size in a support plane, the substrate holder having an annular groove sized to surround an outer edge of the substrate when the substrate is supported on the support surface, the groove having a depth of at least 1.5 mm.

44. The apparatus of claim 43, wherein the groove has a depth of at least 3.0 mm.

45. The apparatus of claim 43, wherein the groove has a depth of at least 4.0 mm.

46. A method of manufacturing an apparatus for processing a substrate, comprising:

forming a substrate holder having a thickness defined as a distance between generally parallel top and bottom surfaces of the substrate holder, the substrate holder having one or more support elements configured to support a substrate of a particular size in a support plane defined by the one or more support elements; and forming a first annular groove in the substrate holder, the groove configured to surround an outer edge of the substrate when the substrate is supported on the one or more support elements, the groove having a depth of at least 25% of the thickness of the substrate holder.

47. The method of claim 46, wherein forming a first annular groove comprises forming a groove open to an upper side of the substrate.

48. The method of claim 46, wherein forming a first annular groove comprises forming a groove open to a lower side of the substrate.

49. The method of claim 46, further comprising forming a second annular groove configured to surround the outer edge of the substrate when the substrate is supported on the one or more support elements, the second groove having a depth of at least 25% of the thickness of the substrate holder.

50. The method of claim 46, further comprising forming a third annular groove configured to surround the outer edge of the substrate when the substrate is supported on the one or more support elements, the third groove having a depth of at least 25% of the thickness of the substrate holder.

51. A method of manufacturing an apparatus for processing a substrate, comprising:

forming a substrate holder having a thickness defined as a distance between generally parallel top and bottom surfaces of the substrate holder, the substrate holder having a support surface configured to extend under and support a substrate of a particular size in a support plane defined by the substrate holder; and forming one or more annular grooves in the substrate holder, each of the one or more grooves surrounding the support surface, the one or more grooves each having a depth of at least 25% of the thickness of the substrate holder.

52. A method of manufacturing an apparatus for processing a substrate, comprising:

forming a substrate holder having a thickness define as a distance between generally parallel top and bottom surfaces of the substrate holder, the substrate holder having one or more support elements configured to support a substrate of a particular size in a support plane defined by the one or more support elements; and forming a first annular groove in the substrate holder, the groove configured to surround an outer edge of the substrate when the substrate is supported on the one or more support elements, the groove having a depth of at least 1.5 mm.

* * * * *